United States Patent
Wey et al.

(10) Patent No.: US 6,297,709 B1
(45) Date of Patent: Oct. 2, 2001

(54) TEMPERATURE COMPENSATED VARIABLE ATTENUATOR

(75) Inventors: Chia-Sam Wey, Arlington; Jukka-Pekka Neitiniemi, Irving; Kim A. Tran, Garland, all of TX (US)

(73) Assignee: Nokia Telecommunications Oy, Espoo (FI)

( * ) Notice: Subject to any disclaimer, the term of this patent is extended or adjusted under 35 U.S.C. 154(b) by 0 days.

(21) Appl. No.: 09/354,356

(22) Filed: Jul. 14, 1999

(51) Int. Cl.[7] .................. H01P 1/22; H03G 11/02
(52) U.S. Cl. .............. 333/17.1; 333/81 R; 455/249.1
(58) Field of Search .................. 333/81 R, 17.1; 455/249.1, 561

(56) References Cited

U.S. PATENT DOCUMENTS

| | | | |
|---|---|---|---|
| 3,921,106 | * 11/1975 | Williams | 333/81 R |
| 4,236,126 | * 11/1980 | Weller et al. | 333/81 R |
| 4,590,417 | * 5/1986 | Tanaami et al. | 333/81 R X |
| 5,204,643 | * 4/1993 | Verronen | 333/81 R |
| 5,262,741 | * 11/1993 | Kitakubo | 333/81 R |
| 5,659,253 | * 8/1997 | Busking | 324/648 |
| 5,767,685 | * 6/1998 | Walker | 333/260 X |
| 5,854,971 | * 12/1998 | Nagoya et al. | 455/126 |
| 6,104,919 | * 8/2000 | Lyall, Jr. et al. | 455/249.1 |

FOREIGN PATENT DOCUMENTS

| 59-22420 | * 2/1984 | (JP) | 333/81 R |
|---|---|---|---|
| 8-274560 | * 10/1996 | (JP) . | |

* cited by examiner

Primary Examiner—Benny Lee
Assistant Examiner—Barbara Summons
(74) Attorney, Agent, or Firm—Thomas B. Hayes; Brian T. Rivers

(57) ABSTRACT

A temperature compensated variable attenuator comprising a variable attenuator having at least one diode with temperature variations across the at least one diode producing a temperature offset signal. A bias source coupled to the variable attenuator supplies a biasing signal to the at least one diode through a temperature compensation source. The temperature compensation source is coupled between the bias source and the variable attenuator with the temperature compensation source comprising at least one diode capable of producing a temperature offset signal approximately equivalent to the temperature offset signal produced by the first at least one diode. The approximate temperature offset signal subtracted from the biasing signal produces a temperature compensated bias signal that is supplied to the variable attenuator.

12 Claims, 3 Drawing Sheets

TEMPERATURE COMPENSATED VARIABLE ATTENUATOR

FIELD OF THE INVENTION

The present invention relates, in general, to variable attenuators, and in particular to a method and apparatus for temperature compensating a variable attenuator for improved performance.

BACKGROUND OF THE INVENTION

In a wireless communication system, for example, a Global System for Mobile (GSM) Communication system using TDMA (Time Division Multiple Access) signaling, the signaling format includes a framed structure comprising a number of time slots. The time slots serve as channels over which mobile and base stations transmit or receive information. Each channel or time slot of a frame is assigned to a different user, with mobile-to-base station (uplink) transmissions carried on one frequency band and base-to-mobile station (downlink) transmissions carried on a separate frequency band.

Transmissions in each channel or time slot are specified to ramp up to a required power level and ramp down to a required power level in a predetermined amount of time within the time slot. GSM specifications require that the power at the start and end of a burst must be at a specified minimum level and that the transition from the minimum level to the final required level must be completed in a specified amount of time. The rates of ramping up and down are specified in order to reduce the generation of transient side bands and interference on adjacent channels.

Referring to FIG. 1, therein is illustrated a prior art power control loop, denoted generally as 10. A variable attenuator 12 is coupled to the input of an amplifier chain 14. Variable attenuator 12 and amplifier chain 14 are coupled between input 16 and output 18. A bias signal, $V_c$, is applied to the variable attenuator 12 on line 20 to control the attenuation characteristics of the variable attenuator 12. Bias signal $V_c$ controls attenuation levels in variable attenuator 12, allowing the power control loop 10 to maintain required power levels when ramping up, ramping down, and during the burst in a time slot of a TDMA signal.

Because of the limited detection range of linear detector 24 at output 18, typically about 45 dB, the operation of power control loop 10 is divided into an open-loop mode and a closed-loop mode. Power control loop 10 may have a dynamic range of about 80 dB in open-loop mode and will run in open-loop mode until the rate of ramp-up has reached a predetermined level, referred to as the switching point. At the switching point, the output 18 can be coupled by line 22 through linear detector 24 through a feedback loop in order to implement the closed-loop mode of operation.

In closed-loop mode, reference signal source 26 supplies reference signal, $V_r$, which is proportional to the required rate of ramping defined by the GSM specification. $V_r$ is compared in comparator 28 to the detected signal, $V_d$, on line 30. The difference, an error signal, $V_e$, is applied to integrator 34 at line 32. Integrator 34 integrates error signal, $V_e$, and applies the result, bias signal, $V_c$, to variable attenuator 12 at line 20 to stabilize power levels when ramping up, ramping down, and during the burst of the TDMA signal. Integrator 34 may comprise a operational amplifier 36 having a non-inverting input coupled to ground through a resistor $R_1$, a inverting input coupled to comparator 28 through a resistor $R_2$ and an output coupled to line 20. Integrator 34 may further comprise a capacitor C coupled between the inverting input and the output of operational amplifier 36. $V_c$ may be calculated as:

$$V_c = \frac{1}{RC}\int (V_r - V_d) dt \qquad \text{Equation 1}$$

Prior to switching from open-loop mode to closed-loop mode, amplifier chain 14 is allowed to ramp up without correction to the level of bias signal $V_c$, while detected signal $V_d$ equals zero or a constant offset voltage. Temperature variations may affect variable attenuator 12 and produce deviations in the attenuation characteristics of variable attenuator 12. The deviations may result in an increase or decrease in the rate of ramping. The increase or decrease in the attenuation characteristics of variable attenuator 12 may increase or decrease the output power, producing unwanted RF spectrum.

FIG. 2A is a plot illustrating deviations in the rate of ramping in the power control loop of FIG. 1 that are generated by changes in the attenuation characteristics of variable attenuator 12. A switching point transient can occur at a switching point 36 when a power control loop switches from open loop to close loop mode. The switching point transient may be caused by deviations in the rate of ramping as indicated by the short, dashed lines 36a and 36b. FIG. 2B is a plot illustrating a switching point transient 38a of the power control loop of FIG. 1 generated from an increase in the attenuation characteristics of variable attenuator 12. The increase in the attenuation characteristics results in a decrease in the power level at output 18. FIG. 2C is a plot illustrating a switching point transient 38b of the power control loop of FIG. 1 generated from a decrease in the attenuation characteristics of variable attenuator 12. The decrease in the attenuation characteristics results in an increase in the power level at output 18.

When power control loop 10 switches from open-loop mode to closed- loop mode with negative feedback, the deviation in the rate of ramping is automatically detected, and bias signal $V_c$ is adjusted to correct for the drift in the attenuation characteristics as a result of the offset signal generated. This immediate correction at the switching point creates transients 38a and 38b as illustrated in FIGS. 2B and 2C, which produces increases or decreases in voltage at output 18 and produces an RF spectrum resulting in adjacent channel interference. FIG. 2D illustrates the unwanted side band harmonics generated in the output power spectrum of power control loop 10 as a result of switching point transients.

SUMMARY OF THE INVENTION

The present invention provides a method and apparatus for temperature compensating a variable attenuator. The method and apparatus implements circuitry that generates at least one compensating bias signal. The at least one bias signal is generated in proportion to signal variations that are generated across the variable attenuator as a result of increases or decreases in the variable attenuator's operating temperature. The method and apparatus provides a variable attenuator that exhibits reduced deviation in attenuation characteristics.

In an embodiment, the invention comprises a variable attenuator having at least one diode affected by temperature variations that produce a temperature-offset signal across the at least one diode. A temperature compensation source is disposed between the variable attenuator and a bias source. The temperature compensation source comprises at least one diode capable of producing a temperature-offset signal approximately equivalent to the temperature-offset signal produced by the at least one diode of the variable attenuator. The compensation source temperature-offset signal is subtracted from a bias signal supplied by the bias source to produce a temperature-compensated bias signal. The temperature compensation bias signal is used to bias and offset signal variations produced across the at least one diode of the variable attenuator.

BRIEF DESCRIPTION OF THE DRAWINGS

For a more complete understanding of the present invention, including its features and advantages, reference is now made to the detailed description of the invention, taken in conjunction with the accompanying drawings of which.

DETAILED DESCRIPTION OF THE INVENTION

While particular embodiments of the present invention are presented in detail below, it will be understood that the present invention provides many applicable inventive concepts, which can be embodied in a wide variety of contexts. The specific embodiments discussed herein are merely illustrative of specific ways to make and use the invention and do not limit the scope of the invention.

Figure 3:
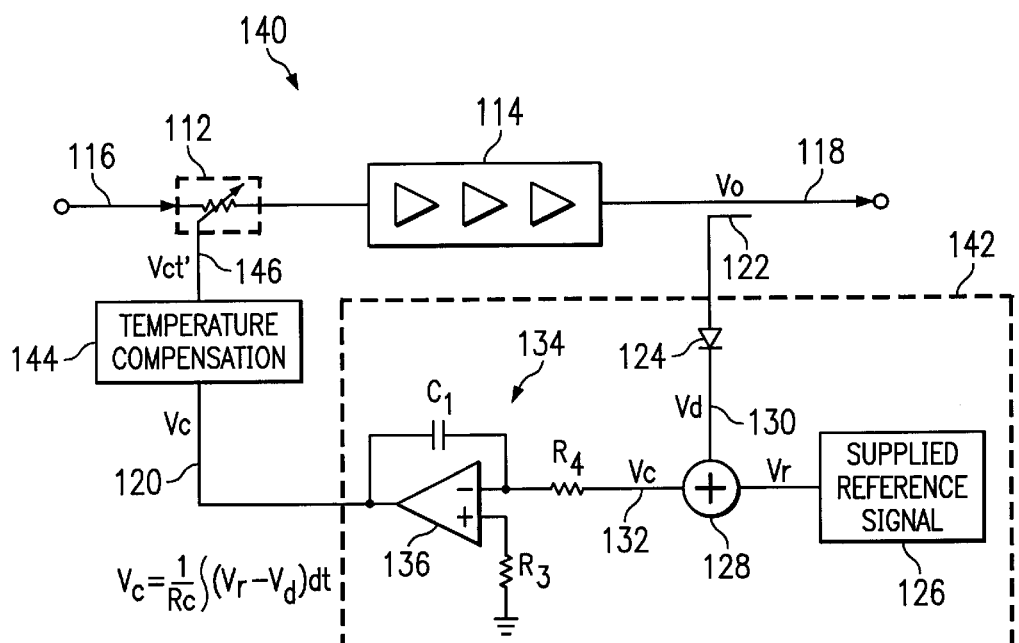
FIG. 3 illustrates a power control loop that includes a temperature compensation source according to an embodiment of the invention.

Referring now to FIG. 3, therein is illustrated a power control loop 140 according to an embodiment of the invention. Variable attenuator 112 is coupled to the input of amplifier chain 114. Variable attenuator 112 and amplifier chain 114 are coupled between input 116 and output 118. Power control loop 140 operates in open-loop mode until the signal $V_O$ at output 118 has ramped up to a predetermined level, typically above 45 dB. When $V_O$ reaches the predetermined level, output 118 is coupled through line 122 to linear detector 124. A reference signal source 126 coupled to a comparator 128 supplies a reference signal, $V_r$, to be compared to a detected signal, $V_d$, provided to comparator 128 on line 130. The difference, an error signal, $V_e$, is supplied to an integrator 134 on line 132. Integrator 134 comprises an operational amplifier 136 having a non-inverting input coupled to ground through a resistor $R_3$, a inverting input coupled to line 132 through a resistor $R_4$ and an output coupled to line 120 where a bias signal $V_c$ is provided. Integrator 134 further comprises a capacitor $C_1$ coupled between the inverting input and the output of Integrator 134.

Prior to and during switching from an open-loop mode to a closed-loop mode, temperature variations may affect or may have affected variable attenuator 112, causing increases or decreases in voltage across variable attenuator 112 and resulting in deviations in the attenuation characteristics of variable attenuator 112. The change in the attenuation characteristics of variable attenuator 112 may result in a deviation in the rate of ramping of the output voltage $V_O$ of power control loop 140 that produces an output power spectrum having unwanted transients.

In the embodiment, a temperature-offset signal produced across variable attenuator 112 is compensated for by coupling a temperature compensation source 144 between bias source 142 and variable attenuator 112. Temperature compensation source 144 generates a temperature-offset signal approximately equivalent to the temperature-offset signal produced across variable attenuator 112. The temperature-offset signal generated in temperature compensation source 144 is utilized to compensate signal $V_c$ at line 120 for the voltage drop across variable attenuator 112.

Voltage increases or decreases across variable attenuator 112 that affect the attenuation characteristics may be approximately reproduced and used to compensate bias signal $V_c$. The temperature-compensated bias signal, $V_{c'}$, on line 146, stabilizes the rate of ramping prior to the switching of variable attenuator 112 from open-loop mode to closed-loop mode, thereby reducing switching transients that may cause adjacent channel interference.

Figure 4:
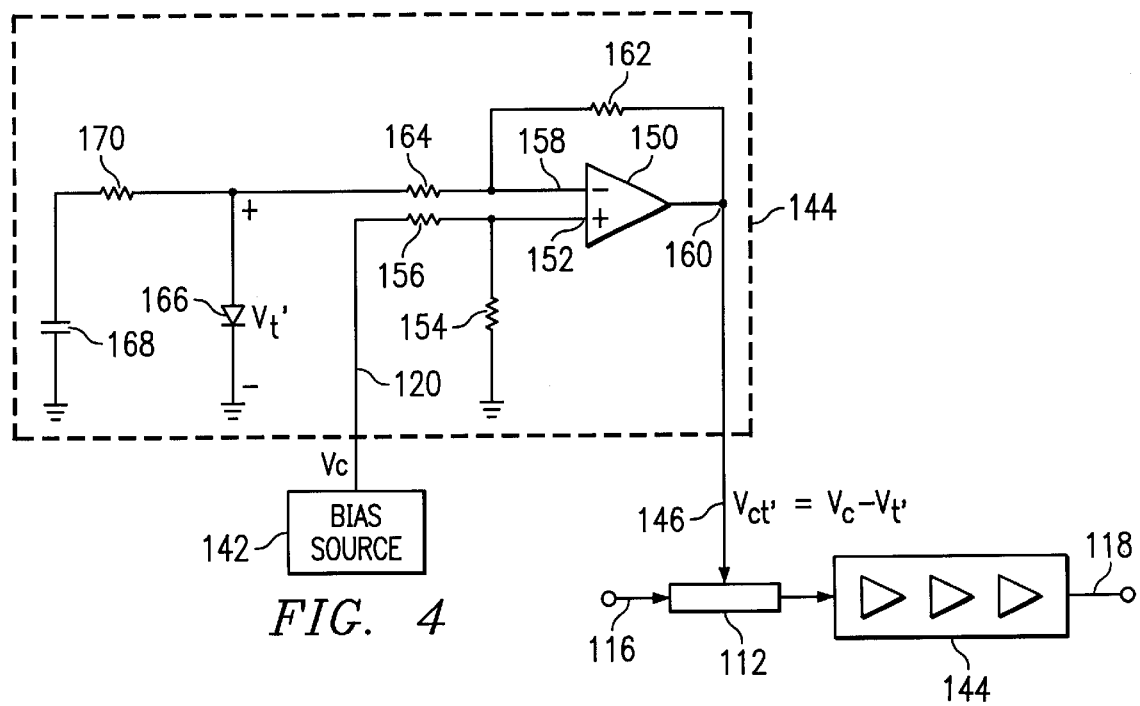
FIG. 4 illustrates the temperature compensation source of the power control loop of FIG. 3.

Referring now to FIG. 4, therein is illustrated temperature compensation source 144 of FIG. 3 according to an embodiment of the invention. Temperature compensation source 144 comprises a differential signal source 150, for example, a comparator, for subtracting one signal from another. Differential signal source 150 has a non-inverting input 152 that is coupled through a divider network of resistors 154 and 156 to bias source 142. Differential signal source 150 also has an inverting input 158 that is coupled to output 160 through a feedback connection comprising resistors 162, 164, 170, voltage source 168 and diode 166.

Figure 5:
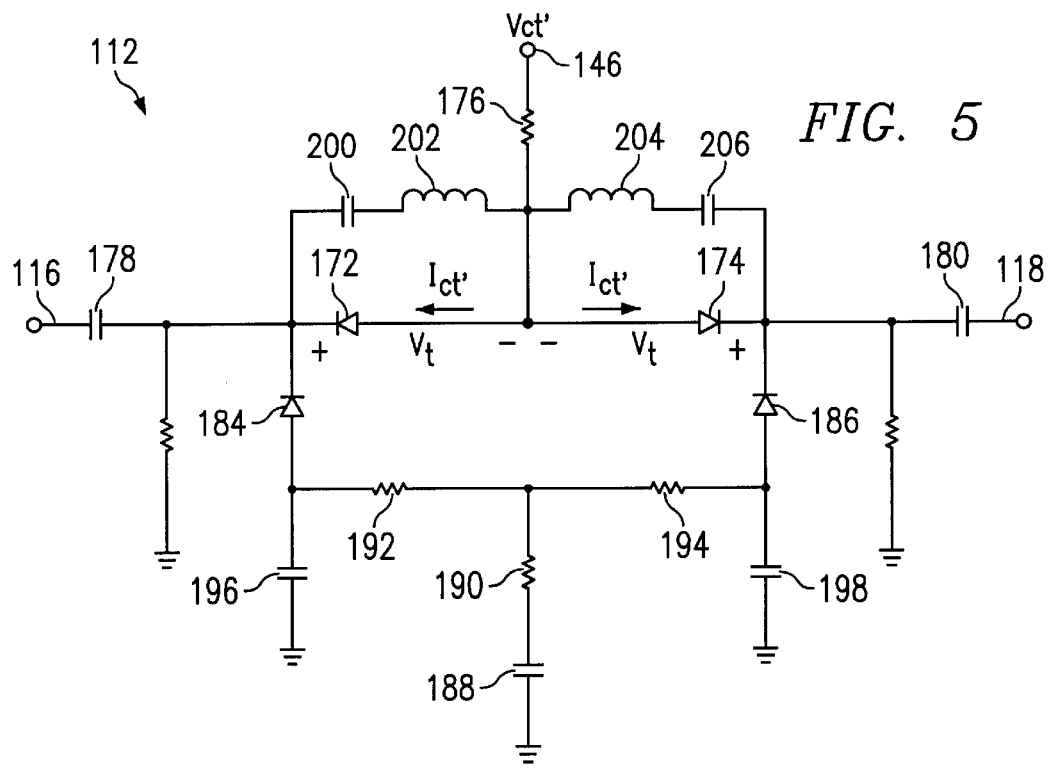
FIG. 5 illustrates a pie network variable attenuator according to an embodiment of the invention.

A signal $V_{t'}$ is applied across diode 166 to inverting input 158 of differential signaling source 150 and subtracted from bias signal $V_c$, which is applied across non-inverting input 152. The signal $V_{t'}$ is applied through series resistors 170 and 164 and across PIN diode 166 and approximately reproduces temperature offset signals generated within variable attenuator 112 as illustrated in FIG. 5. The second bias signal $V_c$ is generated from bias source 142 at line 120.

FIG. 5 illustrates a pie network variable attenuator according to an embodiment of the invention. Variable attenuator 112 comprises input 116 and output 118 with PIN diode 172 and PIN diode 174 in a series branch between input 116 and output 118. The anode of each PIN diode 172,174 is coupled, respectively, to the anode of the other PIN diode 174, 172. Each anode is also coupled to temperature compensating bias signal $V_{c'}$ at point 146 through current limiting resistor 176. The cathode of PIN diode 172 is coupled to input 116 through DC blocking capacitor 178 which provides a direct path for AC current to flow. The cathode of PIN diode 174 is coupled to the output 118 through DC blocking capacitor 180 which also provides a path for AC current to flow.

PIN diodes 184 and 186 are in shunt of the series branch between input 116 and output 118. The cathodes of PIN diodes 184 and 186 are coupled to the cathode of PIN diodes 172 and 174, respectively, to form a pie network type attenuator. DC biasing source 188 supplies bias current to PIN diodes 184 and 186 through a network of resistors 190, 192 and 194. Capacitors 196 and 198 prevent coupling of the AC signal to the DC source.

Variations in temperature across PIN diodes 172 and 174 cause plus or minus variations in voltage, $V_t$, across the series branch between input 116 and output 118 causing deviations in the attenuation characteristics of the series branch. PIN diode 166, which is coupled to inverting input 158 of differential signaling source 150 as illustrated in FIG. 4, approximately reproduces the variations in voltage, $V_t$, across PIN diodes 172 and 174 of variable attenuator 112. PIN diode 166 may be matched to PIN diodes 172 and 174 and exhibit the same properties and characteristics. PIN diodes 166,172 and 174 may also be implemented in the same package so that both operate approximately within the same temperature range and produce similar effects during operation. The approximate reproduction of the variation in $V_{t'}$ is subtracted from bias signal $V_c$ at point 120 and the result, a temperature compensated bias signal $V_{c'}$, at point 146, is applied to the anode of each PIN diode 172 and 174 through resistor 176.

$$V_{c'} = V_c - V_{t'} \quad \text{Equation 2}$$

Capacitor 200 and inductor 202, which are configured in parallel to PIN diode 172, and capacitor 204 and inductor 206, which are configured in parallel to PIN diode 174, act to resonate out the parasitic capacitance of PIN diodes 170 and 172.

Figure 1:
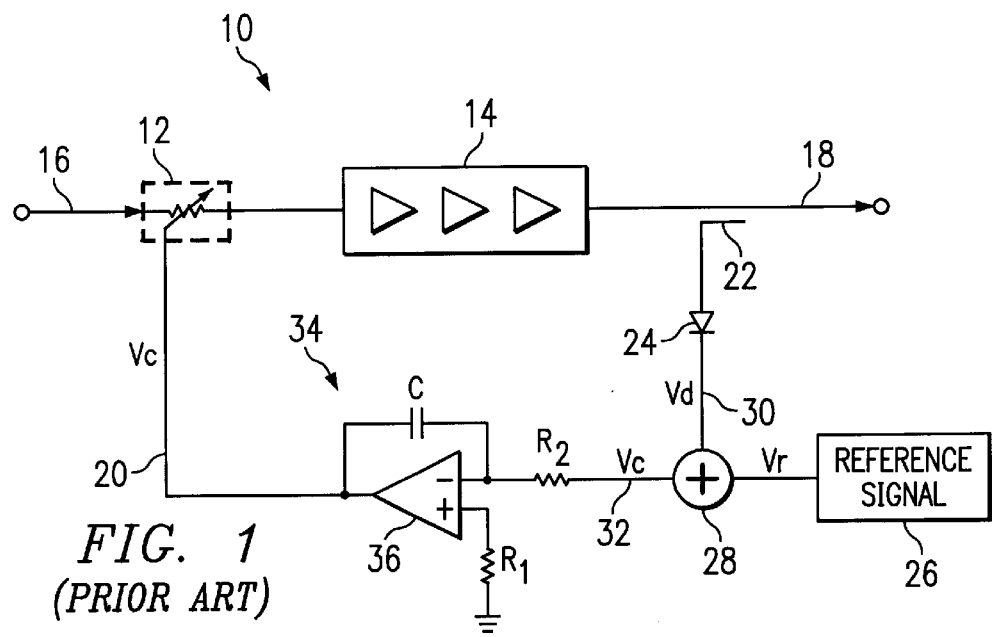
FIG. 1 illustrates a block diagram of a prior art power control loop using negative feedback control.
Figure 2A:
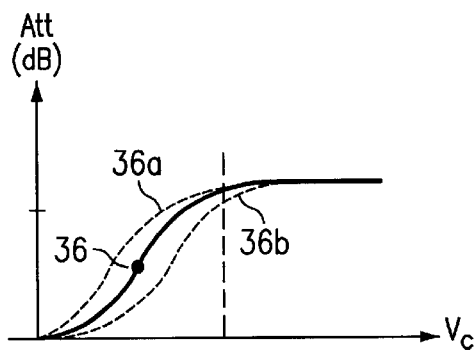
FIG. 2A is a plot illustrating the output of the prior art power control loop of FIG. 1, generated by changes in the attenuation characteristics of a variable attenuator.
Figure 2B:
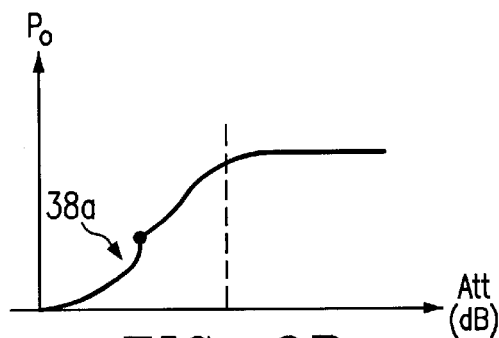
FIG. 2B is another plot illustrating a switching point transient of the prior art power control loop of FIG. 1, generated from a decrease in the attenuation characteristics of a variable attenuator.
Figure 2C:
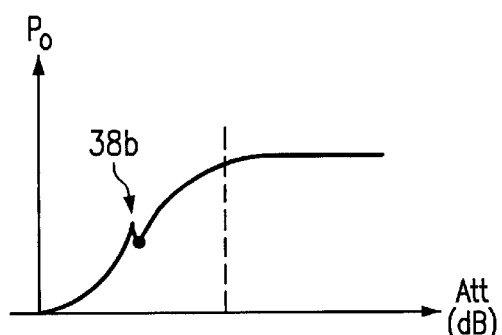
FIG. 2C is a plot illustrating a switching point transient of the prior art power control loop of FIG. 1, generated from an increase in the attenuation characteristics of a variable attenuator.
Figure 2D:
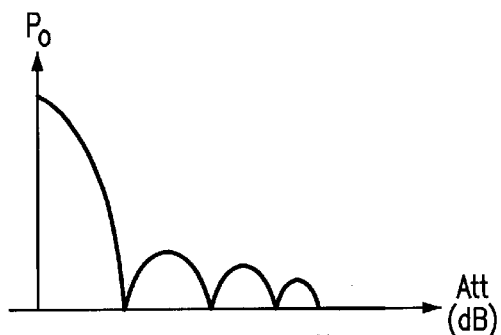
FIG. 2D is an illustration of a power spectrum in which switching point transients generated from variations in attenuation characteristics produce unwanted harmonics in the output of the prior art power control loop of FIG. 1.
Figure 6A:
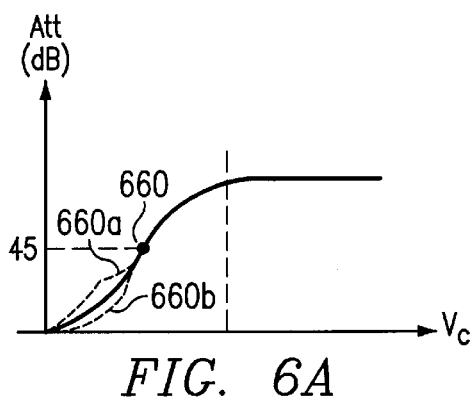
FIG. 6A is a plot illustrating deviations in the rate of ramping in the power control loop of FIG. 3.
Figure 6B:
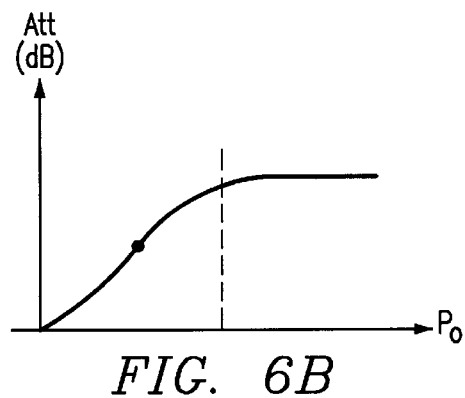
FIG. 6B is a plot of output power of the power control loop of FIG. 3 versus attenuation characteristics of a variable attenuator included in the power control loop.
Figure 6C:
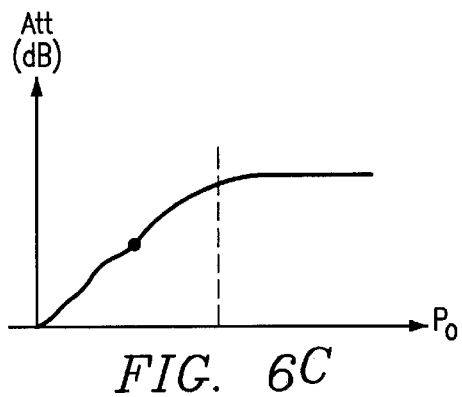
FIG. 6C is another plot of output power of the power control loop of FIG. 3 versus attenuation characteristics of a variable attenuator included in the power control loop.
Figure 6D:
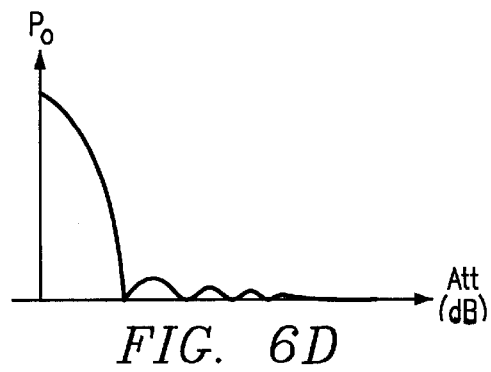
FIG. 6D is an illustration of the output power spectrum of the power control loop of FIG. 3 with the temperature compensation source compensating the variable attenuator to reduce the level of unwanted harmonics.

FIG. 6A is a plot illustrating deviations in the rate of ramping in the power control loop of FIG. 3. The temperature offset compensation signal generated in temperature compensation source 144 and applied to bias signal $V_c$ compensates for deviations in the attenuation characteristics prior to switching from an open-loop to a closed-loop mode. The compensated signal corrects the drift prior to switching, at point 660, as can be seen by the short, dashed lines 660a and 660b in FIG. 6A. FIG. 6B is a plot of output power of power control loop 140 versus attenuation characteristics of the variable attenuator 112 according to the embodiment of FIG. 3. Temperature compensation source 144 compensates for decreases in the attenuation characteristics of variable attenuator 112 prior to switching from an open-loop mode to a closed-loop mode system. FIG. 6C is another plot of output power of power control loop 140 versus attenuation characteristics of the variable attenuator 112 according to the embodiment of FIG. 3. Temperature compensation source 144 compensates for increases in the attenuation characteristics of variable attenuator 112 prior to switching from an open-loop mode to a closed-loop mode system. Transients 38a and 38b of FIGS. 2B and 2C are not exhibited in FIGS. 6B and 6C. FIG. 6D is an illustration of a power spectrum in which the temperature compensation source 144 reduces the level of unwanted harmonics at the output compared to the unwanted harmonics of FIG. 2D.

While this invention has been described with reference to particular embodiments, these descriptions are not intended to be limiting. Various modifications and combinations of the illustrative embodiments, as well as other embodiments of the invention, will be apparent to persons skilled in the art upon reference to the description. It is, therefore, intended that the appended claims encompass any such modifications or embodiments.

What is claimed is:

1. A temperature compensated variable attenuator comprising:

a variable attenuator circuit having a control input and a first at least one diode, wherein temperature variations in said first at least one diode produce a first offset signal;

a bias source having an output, said bias source for supplying a first biasing signal at said output; and a compensation source comprising an input and an output, said input of said compensation source coupled to said output of said biasing source and said output of said compensation source coupled to said control input of said variable attenuator, said compensation source further comprising a second at least one diode that produces a second offset signal approximately equivalent to said first offset signal produced by said first at least one diode, wherein said second offset signal compensates said first biasing signal for the effects of said first offset signal to produce a second biasing signal at the output of said compensation source, wherein said second biasing signal is input to said control input of said variable attenuator.

2. The temperature compensated variable attenuator of claim 1, wherein said variable attenuator circuit comprises a signal input and an output and said first at least one diode comprises first and second diodes, each having an anode and a cathode, wherein the anode of each of said first and second diodes is coupled to said control input forming a series branch between the cathode of said first and second diodes, and wherein the cathode of said first and second diode is coupled to said signal input and output, respectively, of said variable attenuator.

3. The temperature compensated variable attenuator of claim 2, wherein said second at least one diode comprises a third diode having a cathode coupled to ground and an anode, and wherein said compensation source further comprises:

a differential signal source having an inverting input, a non-inverting input and an output, said inverting input coupled to said anode of said third diode, wherein said output of said differential signal source is coupled to said inverting input of said differential signal source and said output of said compensation source, and wherein said non-inverting input of said differential signal source is coupled to said output of said bias source.

4. The temperature compensated variable attenuator of claim 3, wherein said variable attenuator circuit further comprises a fourth and a fifth diode, each having an anode and a cathode, wherein the cathode of said fourth and fifth diode is coupled to the cathode of said first and second diode, respectively, and the anodes of said fourth and fifth diode are coupled to ground.

5. The temperature compensated variable attenuator of claim 4, wherein said variable attenuator circuit further comprises a first capacitor and a first inductor and a second capacitor and a second inductor, wherein said first capacitor and said first inductor are coupled in parallel with said first diode, and said second capacitor and said second inductor are in parallel with said second diode.

6. The temperature compensated variable attenuator of claim 1, wherein said second at least one diode comprises a cathode coupled to ground and an anode, and wherein said compensation source further comprises:

a differential signal source having an inverting input, a non-inverting input, and an output, said inverting input coupled to said anode of said second at least one diode, and wherein said output of said differential signal source is coupled to said inverting input of said differential signal source and said output of said compensation source.

7. A power control loop comprising:

a variable attenuator having a signal input, a control input, an output and a first at least one diode, wherein said signal input of said variable attenuator comprises an input of said power control loop, and wherein temperature variations in said first at least one diode produce a first offset signal;

a power amplifier having an input and an output, wherein said input of said power amplifier is coupled to said output of said variable attenuator, and wherein said output of said power amplifier comprises an output of said power control loop;

a comparator having a first and second input and an output, wherein said first input of said comparator is coupled to a reference signal, and said second input of said comparator is coupled to said output of said power control loop when the rate of ramp-up of a signal at said output of said power control loop is greater than a predetermined level and is otherwise uncoupled from said output of said power control loop;

a bias source having an input and an output, said input of said bias source coupled to said output of said comparator, and further said bias source for supplying a first biasing signal at said output of said bias source; and a temperature compensation source comprising an input and an output, said input of said compensation source coupled to said output of said biasing source, and said temperature compensation source further comprising a second at least one diode producing a second temperature offset signal approximately equivalent to said first offset signal produced by said first at least one diode, wherein said second temperature offset signal compensates said first biasing signal to produce a second biasing signal at the output of said temperature compensation source, and said second biasing signal is input to said control input of said variable attenuator.

8. The power control loop as claimed in claim 7, wherein said first at least one diode comprises a first and a second diode, and wherein said first and second diodes each have an anode and a cathode, wherein the anode of each of said first and second diodes is coupled to said control input of said variable attenuator forming a series branch between the cathodes of said first and second diodes, and wherein the cathode of each of said first and second diodes is coupled to said signal input and output, respectively, of said variable attenuator.

9. The power control loop as recited in claim 7, wherein said second at least one diode comprises a cathode coupled to ground and an anode, and wherein said temperature compensation source further comprises:

a differential signal source having an inverting input, a non-inverting input, and an output, said inverting input coupled to said anode of said second at least one diode, and wherein said output of said differential signal source is coupled to said inverting input of said differential signal source and said output of said compensation source.

10. A base station for a wireless communications system comprising:

a variable attenuator having a signal input, a control input, an output and a first at least one diode, wherein temperature variations in said first at least one diode produce a first offset signal;

a bias source having an output, said bias source for supplying a first biasing signal at said output of said bias source; and a temperature compensation source comprising an input and an output, said input of said compensation source coupled to said output of said biasing source and said output of said compensation source coupled to said control input of said variable attenuator, said temperature compensation source further comprising a second at least one diode producing a second temperature offset signal approximately equivalent to said first offset signal produced by said first at least one diode, wherein said second temperature offset signal compensates said first biasing signal to produce a second biasing signal at the output of said compensation source, and said second biasing signal is input to said control input of said variable attenuator.

11. The base station of claim 10, wherein said first at least one diode comprises a first and a second diode, and wherein said first and second diodes each have an anode and a cathode, wherein the anode of each of said first and second diodes is coupled to said control input forming a series branch between the cathodes of said first and second diodes, and wherein the cathode of said first and second diode is coupled to said signal input and output, respectively, of said variable attenuator.

12. The base station of claim 10, wherein said second at least one diode comprises a cathode coupled to ground and an anode, and wherein said temperature compensation source further comprises:

a differential signal source having an inverting input, a non-inverting input, and an output, said inverting input coupled to said anode of said second at least one diode, and wherein said output of said differential signal source is coupled to said inverting input of said differential signal source and said output of said temperature compensation source.

* * * * *